United States Patent
Mantai et al.

(10) Patent No.: US 12,332,315 B2
(45) Date of Patent: Jun. 17, 2025

(54) ELECTROCHEMICAL CELL MONITORING DEVICE, ELECTROCHEMICAL CELL MONITORING SYSTEM AND METHOD

(71) Applicant: H-TEC Systems GmbH, Augsburg (DE)

(72) Inventors: Nils Mantai, Lübeck (DE); Norbert Bülow, Lübeck (DE)

(73) Assignee: H-TEC Systems GmbH, Augsburg (DE)

( * ) Notice: Subject to any disclaimer, the term of this patent is extended or adjusted under 35 U.S.C. 154(b) by 82 days.

(21) Appl. No.: 18/198,379

(22) Filed: May 17, 2023

(65) Prior Publication Data

US 2023/0375621 A1   Nov. 23, 2023

(30) Foreign Application Priority Data

May 18, 2022 (DE) ..................... 10 2022 112 494.0

(51) Int. Cl.
*G06F 1/3212* (2019.01)
*G01R 31/36* (2020.01)
*G01R 31/367* (2019.01)
*G01R 31/371* (2019.01)

(52) U.S. Cl.
CPC ....... *G01R 31/3646* (2019.01); *G01R 31/367* (2019.01); *G01R 31/371* (2019.01)

(58) Field of Classification Search
USPC ...... 340/636.15, 636.1, 636.12, 636.19, 641, 340/660, 662, 691.6, 693.7
See application file for complete search history.

(56) References Cited

U.S. PATENT DOCUMENTS

| | | | | |
|---|---|---|---|---|
| 2006/0034728 | A1* | 2/2006 | Kloepfer | A61B 5/14532 435/14 |
| 2010/0196716 | A1* | 8/2010 | Ohta | B32B 9/045 428/408 |
| 2010/0308073 | A1* | 12/2010 | Devilbiss | F25D 23/126 62/236 |
| 2013/0217598 | A1* | 8/2013 | Ludwig | G01N 33/54373 422/68.1 |
| 2014/0058559 | A1* | 2/2014 | Haynes | A01K 15/02 119/57.7 |
| 2017/0173262 | A1* | 6/2017 | Veltz | G16H 20/17 |
| 2020/0343631 | A1* | 10/2020 | Uyeno | G01S 7/4915 |

(Continued)

FOREIGN PATENT DOCUMENTS

EP   3612664   2/2020

*Primary Examiner* — Daniel Previl
(74) *Attorney, Agent, or Firm* — COZEN O'CONNOR

(57) ABSTRACT

An electrochemical cell monitoring device, in particular an electrolysis cell, fuel cell and/or battery cell monitoring device having at least one display module, which includes at least one display element, which is provided in order to output at least one information item regarding at least one function parameter of an electrochemical cell in the form of electromagnetic radiation. The electrochemical cell monitoring device includes at least one optical sensor unit arranged in particular separately and spaced apart from the display module, which is provided in order to detect the electromagnetic radiation at least of the display element and from the detected electromagnetic radiation read out at least the information regarding the at least one function parameter of the electrochemical cell.

18 Claims, 4 Drawing Sheets

(56) References Cited

U.S. PATENT DOCUMENTS

2022/0100784 A1\* 3/2022 Diedrich ............... G06F 16/334
2022/0175056 A1\* 6/2022 Pond ...................... H04B 1/385
2022/0407129 A1\* 12/2022 Phares ................ H01M 10/425

\* cited by examiner

ELECTROCHEMICAL CELL MONITORING DEVICE, ELECTROCHEMICAL CELL MONITORING SYSTEM AND METHOD

BACKGROUND OF INVENTION

1. Field of the Invention

The disclosure relates to an electrochemical cell monitoring device, to an electrochemical cell monitoring system, to a method for monitoring an electrochemical cell, and to a method for calibrating the electrochemical cell monitoring system.

2. Description of Related Art

In EP 3 612 664 A1 individual cell voltages of electrolysers are tapped off via electrical contacts. These are then generally connected via cable connections to central computer monitoring systems of electrolysis plants.

SUMMARY OF THE INVENTION

An object of one aspect of the invention is providing a generic device with advantageous characteristics with respect to efficiency.

One aspect of the invention is an electrochemical cell monitoring device, in particular electrolysis cell, fuel cell and/or battery cell monitoring device, having at least one display module, which comprises at least one display element that is provided to output at least one information item regarding at least one function parameter of an electrochemical cell in the form of electromagnetic radiation.

The electrochemical cell monitoring device comprises at least one optical sensor unit arranged in particular separately and spaced apart from the display module, which sensor unit is provided to detect the electromagnetic radiation at least of the display element and, from the detected electromagnetic radiation, read out least the information regarding the at least one function parameter of the electrochemical cell. Because of this, a high efficiency can be advantageously achieved, in particular with respect to costs and/or material requirement. In particular since electrochemical cells such as electrolysis stacks often consist of a multiplicity of individual cells, a necessary total cable length (cable quantity and cable length) can be advantageously reduced substantially. Apart from this, a user comfort can be advantageously increased substantially, in particular through improved clarity and/or improved handling. Advantageously substantially less electronics, in particular substantially fewer evaluation units are necessary, since by way of the proposed electrochemical cell monitoring device a multiplicity of individual voltmeters can be replaced. Advantageously, a more compact design of the plant containing the electrochemical cells can be made possible. In addition, an at least rough assessment of the situation can be advantageously made possible even without evaluation electronics and only by looking at the display module. The electrochemical cell monitoring device is in particular a part of an electrochemical unit, for example of an electrolysis stack, of an electrolyser, of a battery, of a battery system, of a fuel cell or the like. Preferentially, the electrochemical unit is designed as a hydrogen electrolysis device which is provided in particular for electrochemically splitting water into hydrogen and oxygen. The electrochemical device can be provided in order to provide at least one gas, in particular hydrogen, with a positive pressure relative to a surrounding area. The electrochemical cell monitoring device is provided in particular in order to monitor an operating state, preferentially the function parameter, the electrochemical, preferentially during an operation of the electrochemical unit. Preferentially, the electrochemical cell monitoring device is provided in particular to recognise faulty operating states and/or operating states outside an optimal operating range. In particular, the electrochemical cell monitoring device is at least provided in order to record one or multiple function parameters. In particular, the electrochemical cell monitoring device is provided for a safety and/or quality monitoring of the electrochemical unit, in particular by determining individual cell voltages of electrochemical cells. For example, the electrochemical cell monitoring device is provided for recognising short circuits and/or ageing manifestations of the electrochemical cells. "Electromagnetic radiation" is to mean in particular visible light and/or infrared light and/or near-infrared light. Preferentially, the optical sensor unit is arranged at least 1 meter, preferentially at least 5 meters and preferably at least 10 meters distant from the display module. In particular, the optical sensor unit includes at least one sensor, which is sensitive to the spectrum, which can be output by the display element for all possible function parameters. Preferentially, the sensor unit includes at least one sensor for infrared light and/or for visible light. Preferably, the sensor unit includes an infrared camera, a camera for visible light and/or a multi- or hyperspectral camera. In particular, the electrochemical cell monitoring device includes preferentially the optical sensor unit of an evaluation unit which is provided in order to analyse the raw data determined by the sensor and from this determine the function parameter. In particular, the evaluation unit is provided for image recognition and/or image processing of the received optical sensor data.

Further it is proposed that the display module includes at least one further display element or a plurality of further display elements. By way of this, an efficiency can be advantageously improved further, in particular in that the optical sensor unit can simultaneously monitor function parameters of a plurality of electrochemical cells. In particular, the display element and the further display element/the plurality of further display elements are arranged and/or oriented relative to one another. In particular, each display element is provided in order to output at least one information item regarding at least one function parameter of at least one electrochemical cell in the form of electromagnetic radiation. Preferentially, different display elements output different function parameters. Preferentially, different display elements output function parameters of different electrochemical cells. In addition it is conceivable that an electrochemical unit comprises multiple display modules which are monitored by a common optical sensor unit or by different optical sensor units. For example, a display module can comprise more than 4, more than 6, more than 10 or even more than 20 individual display elements.

When each display element is assigned exactly to an individual electrochemical cell and is provided in particular in each case in order to send out an information item regarding the function parameter of exactly this electrochemical cell, a simple, efficient and reliable monitoring can be advantageously ensured. In particular, the display element is assigned to a first electrochemical cell of an electrochemical unit while the further display element is assigned to a second electrochemical cell of the electrochemical unit which is distinct from the first electrochemical cell. Preferably, the display element is assigned to a first electrolysis cell of an electrolysis stack while the further display element is assigned to a second electrolysis cell of the same electrolysis stack, which is distinct from the first electrolysis cell.

Alternatively to this it is conceivable that each display element is assigned to a group of electrochemical cells and in particular provided in each case in order to send out an information item regarding the function parameter of exactly this group of electrochemical cells. The group can include for example two, three, four, five, six, seven, eight or more than eight electrochemical cells. Preferentially, the group includes electrochemical cells arranged adjacently in an electrochemical unit.

Apart from this it is proposed that the display element and the further display element, in particular a plurality of display elements exceeding the number two, is arranged, relative to a horizontal line and/or relative to a vertical line, with an offset to one another. Because of this, a simple, safe and/or reliable assignment of the display elements to individual electrochemical cells, in particular through the evaluation unit, can be advantageously made possible. The offset amounts to in particular at least 10%, preferentially at least 20% and preferably at least 30% of a maximum extent of the display element parallel to the horizontal line and/or to the vertical line. The offset amounts to in particular maximally 200%, preferentially maximally 100% and preferably maximally 75% of a maximum extent of the display element parallel to the horizontal line and/or to the vertical line.

When, alternatively to this, the display element and the further display element, in particular the plurality of display elements exceeding the number two, are arranged horizontally or vertically in a linear row, a highly compact display module can be advantageously achieved. Because of this, a particularly high information density, in particular per optical sensor unit, can be advantageously achieved.

In addition it is proposed that the information regarding the at least one function parameter is encoded in an intensity and/or in a spectrum of the electromagnetic radiation output by the respective display element. Because of this, a particularly accurate and/or reliable determination of the function parameter can be advantageously made possible. In particular, an intensity of the output radiation correlates for example linearly or in another manner with a value of the function parameter. In particular, each intensity value of the output radiation can be assigned a unique value of the function parameter. Alternatively or additionally it is conceivable that the information regarding the at least one function parameter or a further information distinct from the former is encoded in a flashing frequency or in a flashing sequence (comparable to a Morse code).

When the function parameter is formed as an individual cell voltage of the electrochemical cell belonging in particular to the display element, information regarding an operating state, regarding an ageing and/or regarding a functionality of individual electrochemical cells can be advantageously read out easily. Preferentially, the display module forms a pattern/a matrix of display elements from which the state of all electrochemical cells of the electrochemical unit can be read out at once ("at a glance"). In particular, the individual cell voltages displayed by the display element are in a range between approximately 1.5 V and 2.5 V.

When, apart from this, the at least one display element is formed as an LED (light emitting diode) advantageously a high efficiency, in particular with respect to an installation space, with respect to costs and/or with respect to an energy consumption can be achieved. In addition, a simple, precise and in particular direct conversion of an individual cell voltage into a light intensity of the display element can be advantageously made possible. In particular, all display elements of the display module are formed as LED. In particular, the LEDs of the display element are at least substantially identical. Alternatively however it is also conceivable that different LEDs, for example different colour LEDs, are provided as display elements, wherein for example the different colours can be provided for displaying different function parameters or different information regarding the same function parameter. The LED can emit in particular light in a visible spectrum, in an infrared spectrum and/or in a UV spectrum.

When alternatively or additionally the at least one display element is formed as an electrical resistor, which is provided in order to output the information regarding the at least one function parameter of the electrochemical cell in the form of heat radiation, an invisible signal transmission can be advantageously made possible. Advantageously, a cost-effective signal transmission can be additionally achieved. It is conceivable that display elements formed as LED and as electrical resistor are arranged in a common display module all that display elements formed as LED and as electrical resistor are arranged into display modules separated from one another, both of which are assigned to the same electrochemical unit. In particular, the information regarding the at least one function parameter is encoded in an intensity and/or in a spectrum of the electromagnetic radiation output by the electrical resistor. In particular, a thermal imaging camera for reading out the signals of the display element can be provided in this case.

In addition it is proposed that the optical sensor unit is formed as a camera, which is provided in order to carry out automatic image recognition and/or image processing and/or which is connected to an external image recognition and image processing system. Because of this, a high efficiency can be advantageously achieved. Advantageously, a high precision, reliability and/or user-friendliness can be achieved. In particular, the camera is provided for detecting visible light, but can also be designed however, alternatively or additionally, for infrared or ultraviolet light. In addition it is conceivable that the camera is formed as a multi-spectral camera or as a hyperspectral camera. In particular, the camera can include an internal image recognition and image processing system or be in communication with the external image recognition and image processing system. The image recognition and image processing system includes in particular a memory for storing the detected image data, a computer programme for processing/analysing the detected image data and a processor for carrying out the computer programme. In particular, the image detection and image processing system is provided in order to read out from the colour and/or the brightness of the individual display elements the respective information regarding the at least one function parameter of the electrochemical cell. In particular, the image recognition and image processing system is provided in order to precisely assign an electrochemical cell or a group of electrochemical cells to each of the display elements. "Provided" is to mean in particular especially programmed, designed and/or equipped. That an object is provided for a certain function is to mean in particular that the object fulfils and/or carries out this certain function in at least one application and/or operating state. For image recognition, different evaluation algorithms known to the person skilled in the art can be employed.

Further, an electrochemical cell monitoring system having the electrochemical cell monitoring device and having the electrochemical unit comprising a plurality of electrochemical cells, in particular electrolysis cells, fuel cells or battery cells, in particular an electrolysis stack, a fuel cell stack or a battery is proposed. Because of this, a high efficiency can be advantageously achieved, in particular with respect to costs and/or material requirement.

When the display module is arranged on the electrochemical unit a simple assignment of detected information can be advantageously made possible. In addition, a material requirement, in particular a cable requirement, can be advantageously kept low.

However, when alternatively the display module is arranged separately and spaced apart from the electrochemical unit a simultaneous monitoring of a particularly large number of electrochemical units can be advantageously made possible in particular with only a small number of cameras. For example, the display module of an electrochemical unit can be arranged in particular together with further display modules of other electrochemical units in a central location of a plant. Alternatively, the display module could be additionally equipped with light wave guides, which transmit the light of the display elements to a location arranged separately from the electrochemical unit and spaced apart from the electrochemical unit. In addition it is conceivable that the display elements actually do not emit electromagnetic radiation until a limit value is exceeded and/or until a limit value is undershot.

In addition it is proposed that the electrochemical cell monitoring system comprises at least one further electrochemical unit, in particular a further electrolysis stack, a further fuel cell stack or a further battery having at least one further display module, wherein the optical sensor unit is provided in order to simultaneously or successively detect the electromagnetic radiations of display elements of the display module of the electrochemical unit and of the further display module of the further electrochemical unit and from the detected electromagnetic radiations read out simultaneously and/or successively the information regarding the function parameters of the individual electrochemical cells of the electrochemical unit and of the further electrochemical unit. Because of this, a particularly high efficiency can be advantageously achieved. In particular, the display modules of the electrochemical unit and at least of the further electrochemical unit are arranged in such a manner that an individual camera, if required taking into account a panning of the camera, can read out both display modules. In particular, more than two electrochemical units, preferentially display modules of more than two electrochemical units, are arranged in a common field of vision of an individual camera.

Further it is proposed that at least the electrochemical unit has at least one calibration operating mode which is provided in order to apply a known calibration function parameter to the electrochemical cells of the electrochemical unit, wherein the known calibration function parameter is a protective voltage that is distinct from zero in the off-state of the electrochemical unit or a start-up and/or cut-off voltage that is distinct from a, compared with a standard operating current, low start-up current/cut-off current during the starting and/or during the stopping of the electrochemical unit. Because of this, a high accuracy can be advantageously achieved in particular also over longer operating periods. In particular, the known calibration function parameter, in particular the protective voltage, the start-up voltage and/or the cut-off voltage are constant in time. For example, the known calibration function parameter could be constant at a voltage value between 1.42 V and 1.55 V. When the constant voltage value in the calibration operating mode is known, the voltage-dependent intensity profile and/or the voltage-dependent colour profile of each individual display element can be calibrated by way of determining the intensity or the spectral colour in the calibration operating mode. Alternatively or additionally it is conceivable that for improving the calibration a second known calibration function parameter is applied to the electrochemical cells of the electrochemical unit. For example, the protective voltage, the start-up voltage and/or the cut-off voltage could be periodically varied or assume different values in each case for this purpose. In the case of an electrolyser, the protective voltage is preferentially in the vicinity (e.g. less than 10% distant) but below a minimal operating voltage necessary for an electrolysis.

In addition, a method for monitoring an electrochemical cell, in particular by the electrochemical cell monitoring device is proposed, wherein at least one information item regarding at least one function parameter of the electrochemical cell is output in the form of electromagnetic radiation, wherein in at least one method step the output electromagnetic radiation is detected by an optical sensor unit arranged in particular separately and spaced apart from the electrochemical cell and wherein in at least one further method step from the detected electromagnetic radiation at least the information regarding the at least one function parameter of the electrochemical cell is read out. Because of this, a high efficiency can be advantageously achieved, in particular with respect to costs and/or material requirement.

Apart from this, a method for calibrating the electrochemical cell monitoring system is proposed in this connection, wherein a protective voltage that is distinct from zero is generated in the off-state of the electrochemical unit or a start-up voltage/cut-off voltage that is distinct from zero which is generated by a, compared with a standard operating current, low start-up current/cut-off current during the starting/stopping of the electrochemical unit, is used for calibrating the read-out function parameters. Because of this, a high accuracy of the monitoring of the electrochemical cells can be advantageously ensured, in particular even over extended operating periods.

The electrochemical cell monitoring device according to the invention, the electrochemical cell monitoring system according to the invention and the method according to the invention should not be restricted to the application and embodiment described above. In particular, the electrochemical monitoring device according to the invention, the electrochemical cell monitoring system according to the invention and the method according to the invention can, for fulfilling a function described herein, comprise a number deviating from a number of individual elements, components and units mentioned herein.

BRIEF DESCRIPTION OF THE DRAWINGS

Further advantages are obtained from the following drawing description. In the drawings, two exemplary embodiments of the invention are shown. The drawings, the description and the claims contain numerous features in combination. Practically, the person skilled in the art will also consider the features individually and combine these to form practical further combinations.

It shows.

DETAILED DESCRIPTION OF THE PRESENTLY PREFERRED EMBODIMENTS

Figure 1A:
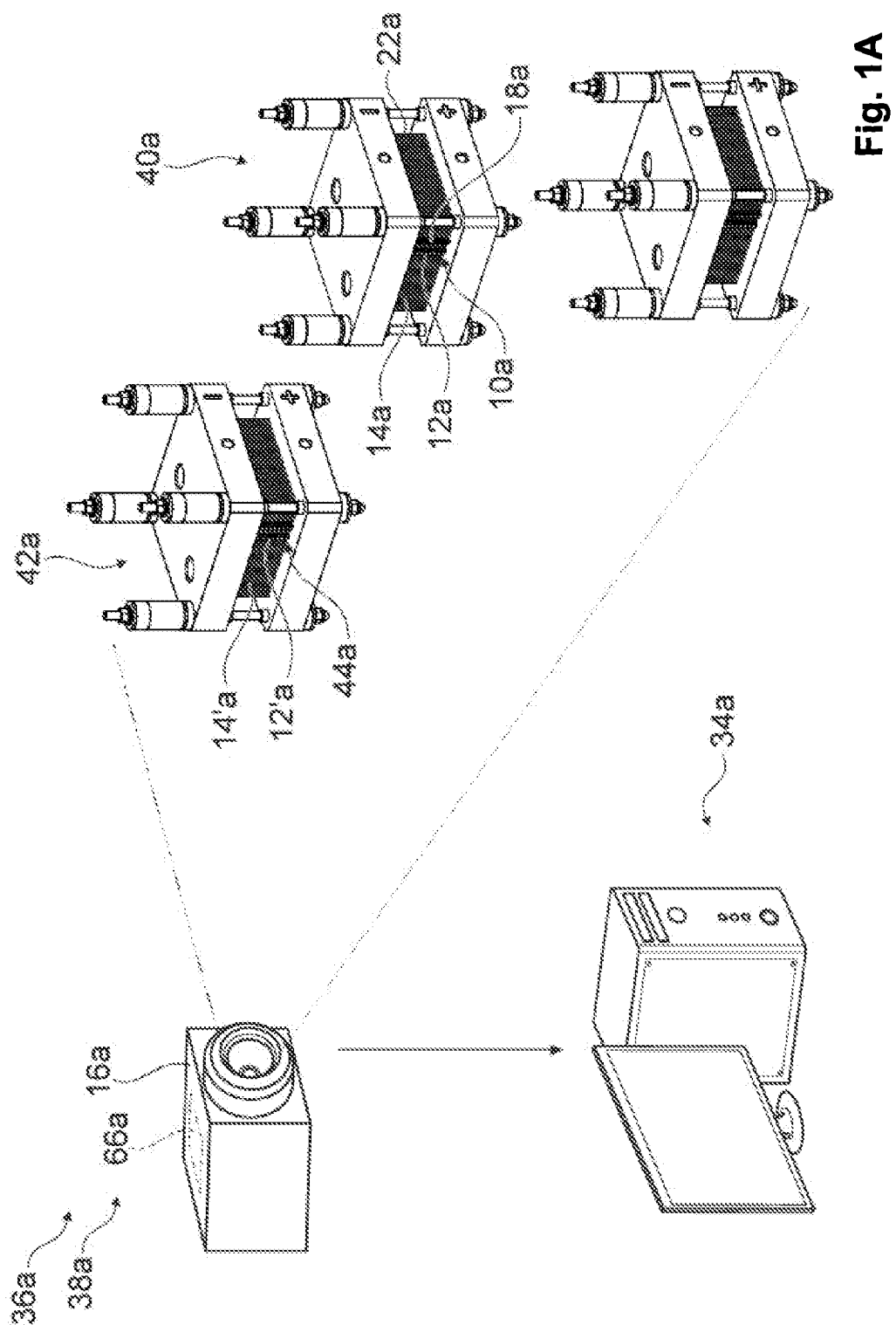
FIG. 1A is a schematic representation of an electrochemical cell monitoring system having an electrochemical cell monitoring device.

FIG. 1A shows a schematic representation of an electrochemical cell monitoring system 36a. The electrochemical cell monitoring system 36a comprises an electrochemical cell monitoring device 38a. The electrochemical cell monitoring device 38a is formed as an electrolysis cell monitoring device. Alternatively, the electrochemical cell monitoring device 38a could also be formed as a fuel cell monitoring device and/or as a battery cell monitoring device. The electrochemical cell monitoring device 38a comprises an electrochemical unit 40a. The electrochemical cell monitoring device 38a comprises at least one further electrochemical unit 42a. The electrochemical unit 40a and the further electrochemical unit 42a are at least substantially formed identically to one another, but could also be formed distinct from one another. The electrochemical units 40a, 42a are each formed as electrolysis stacks, in particular in a manner known from the prior art to the person skilled in the art. The electrolysis stacks form parts of a common electrolysis plant. The electrolysis stacks in the present case are formed as polymer electrolyte membrane electrolysis stacks known to the person skilled in the art. Alternatively, at least one part of the electrochemical units 40a, 42a could also be formed as another electrolyser type, such as among others for example an anion exchange membrane electrolyser (AEM), as fuel cell stacks or batteries. The electrochemical units 40a, 42a comprise a plurality of electrochemical cells 14a, 22a, 24a each. The electrochemical cells 14a, 22a, 24a are formed as electrolysis cells of the electrolysis stack. Alternatively, the electrochemical cells 14a, 22a, 24a could also form a fuel cell of a fuel cell stack or battery cells of a battery.

The electrochemical cell monitoring device 38a comprises a display module 10a. The display module 10a is arranged on the electrochemical unit 40a. The electrochemical cell monitoring device 38a comprises a further display module 44a. The further display module 44a is arranged on the further electrochemical unit 42a. The display module 10a and the further display module 44a include a plurality of display elements 12a, 18a, 20a each. The display elements 12a, 18a, 20a are formed as LEDs. Alternatively, the display elements 12a, 18a, 20a could also be formed as electrical resistors. The display elements 12a, 18a, 20a are provided in order to output at least one information item regarding a function parameter of exactly one electrochemical cell 14a, 22a, 24a in the form of electromagnetic radiation. Each of the display elements 12a, 18a, 20a is assigned exactly one electrochemical cell 14a, 22a, 24a. Then, the function parameter is formed as exactly one individual cell voltage of the associated electrochemical cell 14a, 22a, 24a. Alternatively, the display elements 12a, 18a, 20a could also be provided for jointly outputting at least one information item regarding at least one function parameter of a group of electrochemical cells 14a, 22a, 24a including multiple electrochemical cells 14a, 22a, 24a in the form of electromagnetic radiation. Each of the display elements 12a, 18a, 20a would be assigned to exactly one defined group of electrochemical cells 14a, 22a, 24a. Then, the function parameter is formed as a sum of individual cell voltage of the electrochemical cells 14a, 22a, 24a belonging to the group. In the case of the LED display elements 12a, 18a, 20a the information regarding the at least one function parameter is encoded in an intensity and/or in a spectrum of the electromagnetic radiation output by the respective LED display element 12a, 18a, 20a. In the case of the display elements (12a, 18a, 20a) formed as electrical resistor, the information regarding the at least one function parameter is encoded in an intensity and/or in a spectrum of the heat radiation output by the respective display element 12a, 18a, 20a.

The electrochemical cell monitoring device 38a comprises an optical sensor unit 16a. The optical sensor unit 16a is arranged separately and spaced apart from the display module 10a. The optical sensor unit 16a is provided in order to detect the electromagnetic radiation of at least the display element 12a and from the detected electromagnetic radiation read out at least the information regarding the at least one function parameter of the electrochemical cell 14a. The optical sensor unit 16a is formed as a camera. The camera is provided in order to carry out automatic image recognition and/or image processing of the detected images representing the display modules 10a, 44a. The camera comprises an evaluation unit 66a. The evaluation unit 66a is formed as a computer system with processor and memory and evaluation software. The evaluation unit 66a is provided for carrying out the image recognition and/or image processing of the detected images. Alternatively, the electrochemical cell monitoring system 36a can comprise an external image recognition and image processing system 34a. In this case, the camera is connected to the external image recognition and image processing system 34a and transmits the detected images of the display modules 10a, 44a to the external image recognition and image processing system 34a for analysis and evaluation.

The optical sensor unit 16a is provided in order to simultaneously or successively detect the electromagnetic radiations of display elements 12a, 12'a, 18a, 20a of the display module 10a of the electrochemical unit 40a and of the further display module 44a of the further electrochemical unit 42a and from the detected electromagnetic radiations, simultaneously and/or successively read out the information regarding the function parameters of the individual electrochemical cells 14a, 14'a, 22a of the electrochemical unit 40a and of the further electrochemical unit 42a.

The electrochemical unit 40a, 42a has at least one calibration operating mode. The calibration operating mode is provided in order to apply a known calibration function parameter to the monitored electrochemical cells 14a, 22a, 24a of the electrochemical unit 40a, 42a. The known calibration function parameter is formed as a protective voltage which in the off-state of the electrochemical unit 40a, 42a is distinct from zero. Alternatively or additionally, the calibration function parameter can also be formed as a start-up and/or cut-off voltage distinct from zero generated by a, compared with a standard operating current, low start-up current/cut-off current during the starting and/or during the stopping of the electrochemical unit 40a, 42a.

Figure 1B:
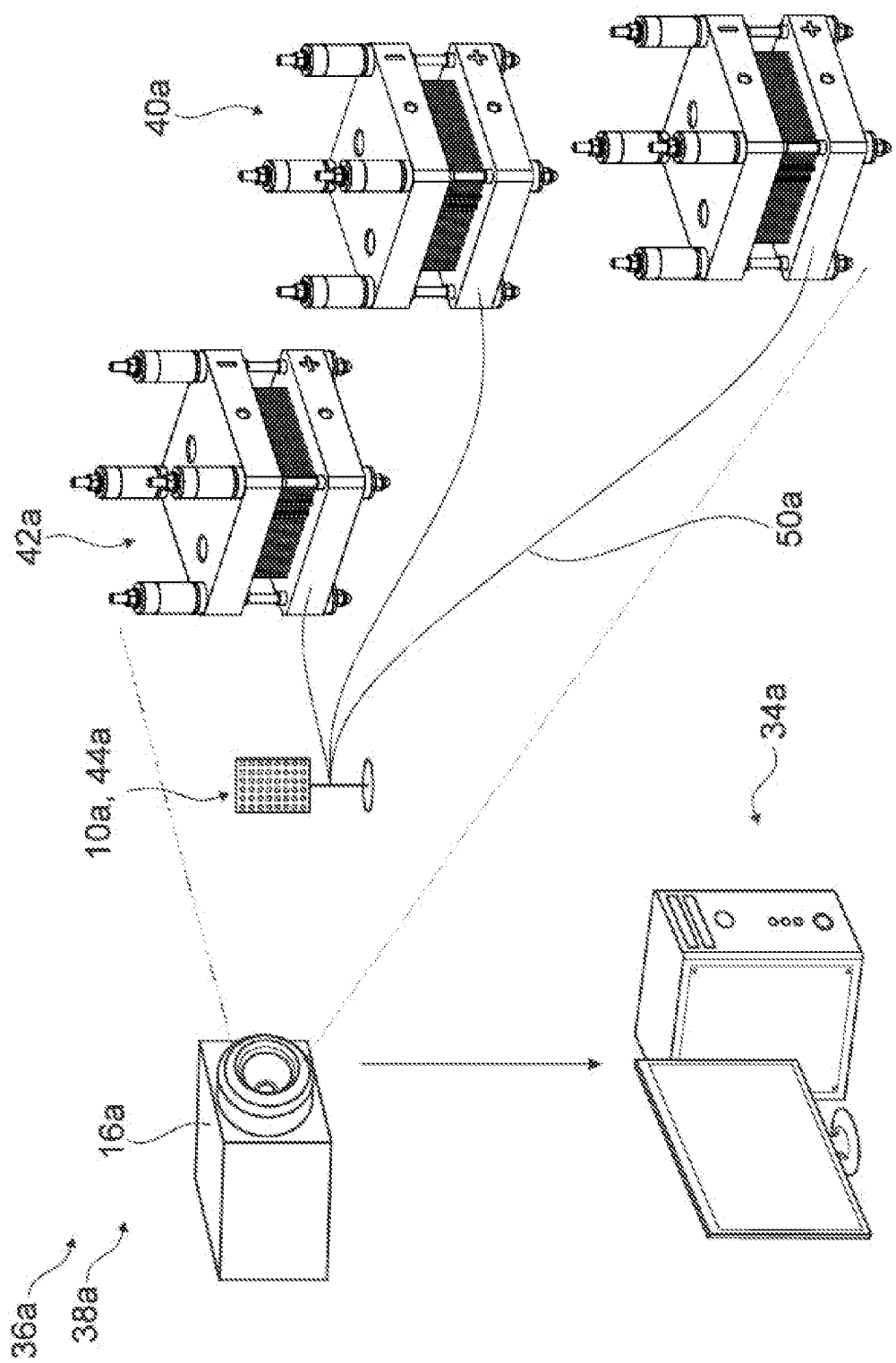
FIG. 1B is a schematic representation of the electrochemical cell monitoring system.

FIG. 1b shows a schematic representation of the electrochemical cell monitoring system 36a with an alternative arrangement of the components. In this alternative configuration, the display modules 10a, 44a are arranged separately and spaced apart from the electrochemical units 40a, 42a. The display modules 10a, 44a are connected by cables 50a to the electrochemical units 40a, 42a. The display modules 10a, 44a are combined in a common display module. By way of the cables 50a, the voltages are transmitted from the respective electrochemical cells 14a, 22a, 24a to the display elements 12a, 18a, 20a of the display modules 10a, 44a. The display modules 10a, 44a can thus be monitored centrally.

Figure 2:
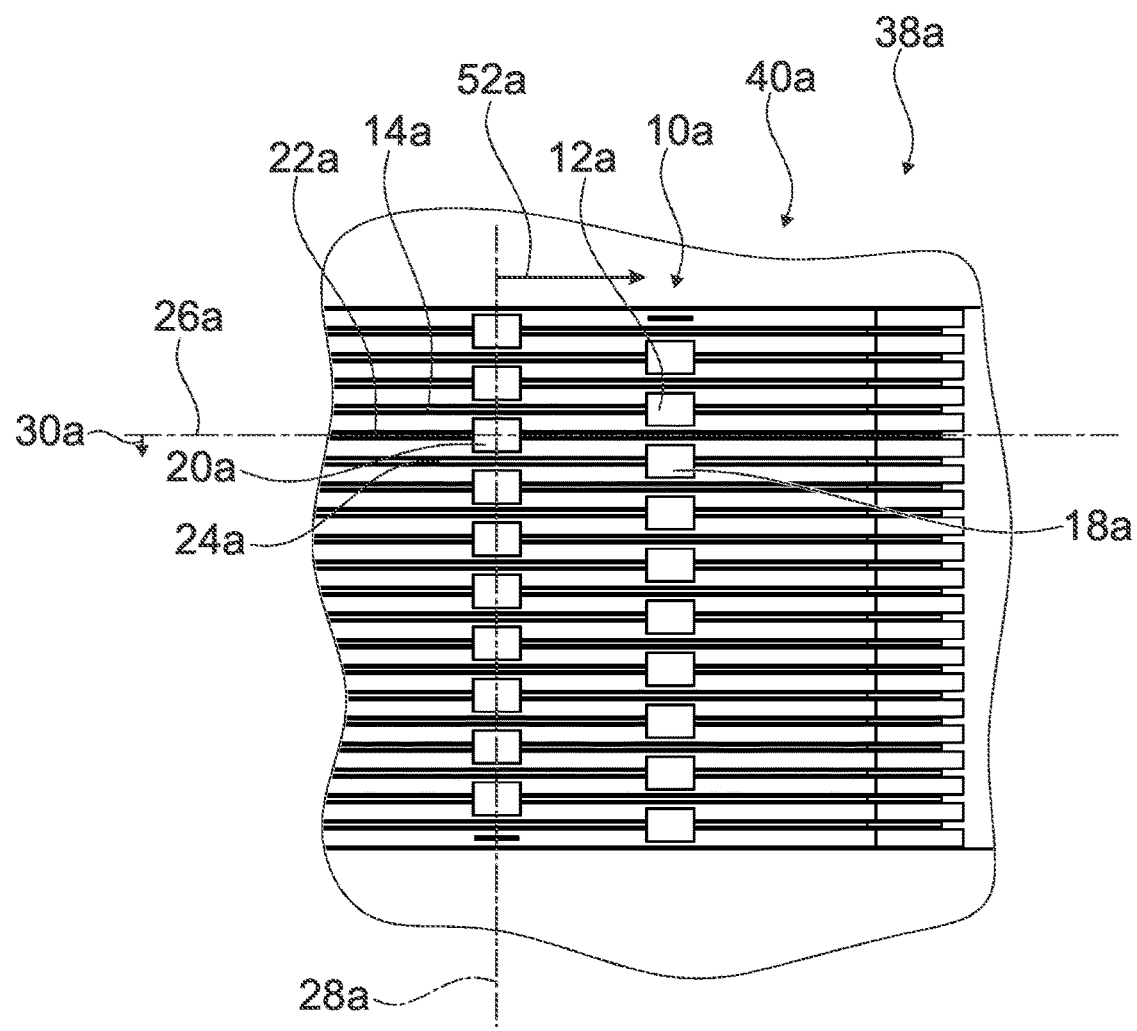
FIG. 2 is an extract of a schematic front view of an individual electrochemical unit having a display module of the electrochemical cell monitoring system.

FIG. 2 shows an extract of a schematic front view of an individual electrochemical unit 40a having the display module 10a comprising the display elements 12a, 18a, 20a in a provided installation position. The display element 12a and the further display elements 18a, 20a are arranged relative to a line 26a that is horizontal relative to the provided installation position with an offset 30a to one another. The display element 12a and the further display elements 18a, 20a can be additionally arranged relative to a line 28 that is vertical relative to the installation position with an offset 52a to one another. In the configuration exemplarily shown in FIG. 2 only the display element 12a and one of the further display elements 18a are arranged with an offset 52a relative to the vertical line 28a. The display element 12a and the other further display element 20a are arranged relative to one another without offset relative to the vertical line 28a. Each of the offsets 30a, 52a is smaller than the extent of the display elements 12a, 18a, 20a in the respective same direction as the offsets 30a, 52a.

Figure 3:
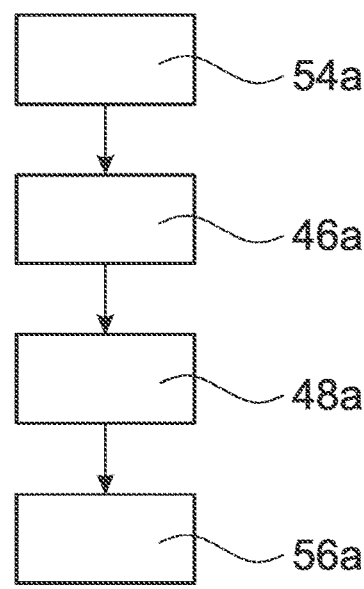
FIG. 3 is a schematic flow diagram of a method for monitoring electrochemical cells by the electrochemical cell monitoring device.

FIG. 3 shows a schematic flow diagram of a method for monitoring electrochemical cells 14a, 22a, 24a by the electrochemical cell monitoring device 38a. In the method, at least one information item regarding at least one function parameter of the electrochemical cell 14a, 22a, 24a is output in the form of electromagnetic radiation. Voltages on the electrochemical cells 14a, 22a, 24a drop in at least one operating state. From the dropping voltages, function parameters of the respective electrochemical cells and/or information regarding function parameters of the respective electrochemical cells 14a, 22a, 24a can be read out. These voltages are passed on to the display elements 12a, 18a, 20a assigned to the electrochemical cells 14a, 22a, 24a. In at least one method step Ma, the display elements 12a, 18a, 20a are operated with the voltages dropping on the electrochemical cells 14a, 22a, 24a. Because of this, the display elements 12a, 18a, 20a are illuminated or heated dependent on the voltage, i.e. the display elements 12a, 18a, 20a emit electromagnetic radiation in which the function parameter is encoded. In at least one method step 46a, the electromagnetic radiation output by the display elements 12a, 18a, 20a is detected by the optical sensor unit 16a. In at least one further method step 48a, at least the information regarding the at least one function parameter of the electrochemical cell 14a, 22a, 24a is read out from the detected electromagnetic radiation. In the method step 48a, the image data detected by the optical sensor unit 16a is analysed and evaluated. In the method step 48a, a wavelength determination and/or an intensity determination of the signals from the image data detected by the display module 10a are read out and converted into the function parameter. In at least one method step 56a, the determined function parameters are output, for example by means of a screen display.

Figure 4:
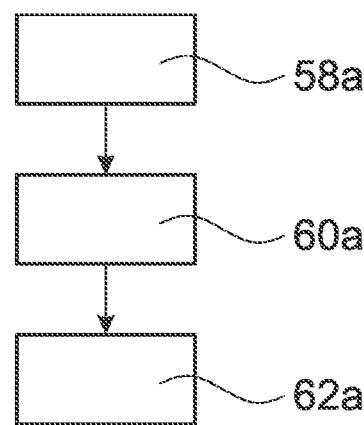
FIG. 4 is a schematic flow diagram of a method for calibrating the electrochemical cell monitoring system.

FIG. 4 shows a schematic flow diagram of a method for calibrating an electrochemical cell monitoring system 36a. In at least one method step 58a, a protective voltage that is distinct from zero is applied to the electrochemical cells 14a, 22a, 24a in the off-state of the electrochemical unit 40a or a start-up voltage that is distinct from zero which is generated by a start-up current that is low compared with a standard operating current when starting the electrochemical unit 40a, or a cut-out voltage that is distinct from zero which is generated by a cut-out current that is low compared with a standard operating current when stopping the electrochemical unit 40a. Because of this, a calibration signal in the form of electromagnetic waves each is emitted by the display elements 12a, 18a, 20a, which are assigned to the electrochemical cells 14a, 22a, 24a. In at least one method step 60a, the calibration signals are detected by the optical sensor unit 16a. In at least one method step 62a, the received calibration signals are used for calibrating the read-out function parameters. In the method step 62a, evaluation functions of the image recognition and/or image processing system 34a, each of which are assigned to individual display elements 12a, 18a, 20a, are calibrated by the received calibration signals.

Figure 5:
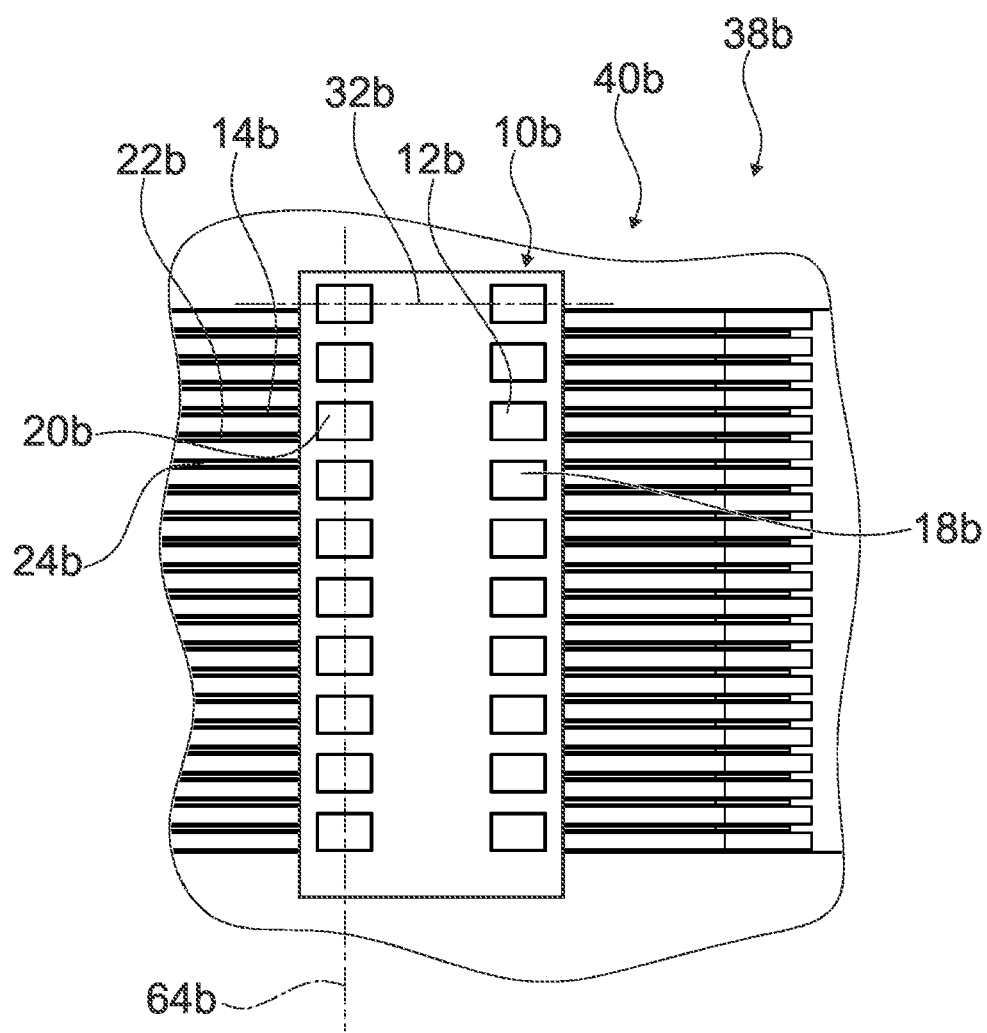
FIG. 5 is an extract of a schematic front view of an individual electrochemical unit having a display module of the electrochemical cell monitoring system.

In FIG. 5, a further exemplary embodiment of the invention is shown. The following descriptions and the drawings are substantially limited to the differences between the exemplary embodiments, wherein with respect to identically designated components, in particular with respect to components having same reference numbers, the drawings and/or the description of the other exemplary embodiments, in particular of the FIGS. 1 to 4 can basically also be made reference to. To distinguish the exemplary embodiments, the letter a is suffixed to the reference numbers of the exemplary embodiments in the FIGS. 1 to 4. In the exemplary embodiment of FIG. 5, the letter a is replaced with the letter b.

FIG. 5 shows an extract of a front view of an individual electrochemical unit 40b with an alternative display module 10b. The alternative display module 10b comprises a plurality of display elements 12b, 18b, 20b. The display elements 12b, 18b, 20b are arranged horizontally and vertically along linear rows 32b, 64b. The display elements 12b, 18b, 20b of a horizontal row 32b are substantially free of vertical offsets. The display elements 12b, 18b, 20b of a vertical linear row 64b are substantially free of horizontal offsets.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:
1. An electrochemical cell monitoring device, comprising
   at least one display module, having at least one display element, configured to output at least one information item regarding at least one function parameter of an electrochemical cell as electromagnetic radiation;
   at least one optical sensor unit arranged separately and spaced apart from the display module, configured to detect the electromagnetic radiation at least of the at least one display element and from the detected elec- tromagnetic radiation, read out at least the information regarding the at least one function parameter of the electrochemical cell.

2. The electrochemical cell monitoring device according to claim 1, wherein the display module includes at least one further display element or a plurality of further display elements.

3. The electrochemical cell monitoring device according to claim 2, wherein each display element is assigned to a respective electrochemical cell, and is provided to emit an information item regarding the function parameter of the respective electrochemical cell.

4. The electrochemical cell monitoring device according to claim 2, wherein the display element and the further display element are arranged relative to a horizontal line and/or relative to a vertical line with an offset to one another.

5. The electrochemical cell monitoring device according to claim 2, wherein the display element and the further display element are arranged horizontally or vertically in a linear row.

6. The electrochemical cell monitoring device according to claim 1, wherein the information regarding the at least one function parameter is encoded in an intensity and/or in a spectrum of the electromagnetic radiation output by the respective display element.

7. The electrochemical cell monitoring device according claim 1, wherein the function parameter is formed as an individual cell voltage of an associated electrochemical cell.

8. The electrochemical cell monitoring device according to claim 1, wherein the at least one display element is formed as an LED.

9. The electrochemical cell monitoring device according to claim 1, wherein the at least one display element is formed as electrical resistor, which is configured to output the information regarding the at least one function parameter of the electrochemical cell in the form of thermal radiation.

10. The electrochemical cell monitoring device according to claim 1, wherein the optical sensor unit is a camera, configured to carry out an automatic image recognition and/or image processing and/or which is connected to an external image recognition and image processing system.

11. The electrochemical cell monitoring device according to claim 1, wherein the electrochemical cell is an electrolysis cell, a fuel cell, and/or battery cell monitoring device.

12. An electrochemical cell monitoring system comprising:
an electrochemical cell monitoring device) comprising
at least one display module having at least one display element, configured to output at least one information item regarding at least one function parameter of an electrochemical cell as electromagnetic radiation;
at least one optical sensor unit arranged separately and spaced apart from the display module, configured to detect the electromagnetic radiation at least of the at least one display element and from the detected electromagnetic radiation, read out at least the information regarding the at least one function parameter of the electrochemical cell; and
an electrochemical unit comprising a plurality of electrochemical cells, configured as electrolysis cells, fuel cells or battery cells, an electrolysis stack, a fuel cell stack, or a battery.

13. The electrochemical cell monitoring system according to claim 12, wherein the display module is arranged on the electrochemical unit.

14. The electrochemical cell monitoring system according to claim 12, wherein the display module is arranged separately and spaced apart from the electrochemical unit.

15. The electrochemical cell monitoring system according to claim 12, wherein at least one further electrochemical unit, configured as a further electrolysis stack, a further fuel cell stack or a further battery, having at least one further display module, wherein the optical sensor unit is configured to detect simultaneously or successively the electromagnetic radiations of display elements of the display module of the electrochemical unit and of the further display module of the further electrochemical unit and from the detected electromagnetic radiations simultaneously and/or successively read out the information regarding the function parameters of an individual electrochemical cells of the electrochemical unit and of the further electrochemical unit.

16. The electrochemical cell monitoring system according to claim 12, wherein at least the electrochemical unit comprises at least one calibration operating mode configured to apply a known calibration function parameter to the electrochemical cells of the electrochemical unit, wherein the known calibration function parameter is a protective voltage distinct from zero in an off-state of the electrochemical unit or a start-up and/or cut-off voltage that is distinct from zero generated from a start-up current/cut-off current that is low compared with a standard operating current during starting and/or during stopping of the electrochemical unit.

17. A method for monitoring an electrochemical cell, by an electrochemical cell monitoring device having at least one display module, having at least one display element, configured to output at least one information item regarding at least one function parameter of an electrochemical cell as electromagnetic radiation; and at least one optical sensor unit arranged separately and spaced apart from the display module, configured to detect the electromagnetic radiation at least of the at least one display element and from the detected electromagnetic radiation, read out at least the information regarding the at least one function parameter of the electrochemical cell, comprising:
outputting at least one information item regarding at least one function parameter of the electrochemical cell as the electromagnetic radiation;
detecting the output electromagnetic radiation by an optical sensor unit arranged separately and spaced apart from the electrochemical cell; and
reading out at least the information regarding the at least one function parameter of the electrochemical cell from the detected electromagnetic radiation.

18. The method for monitoring an electrochemical cell according to claim 17, further comprising
calibrating the electrochemical cell monitoring system, wherein a protective voltage that is distinct from zero is generated in an off-state of the electrochemical unit or a start-up voltage/cut-out voltage that is distinct from zero which is generated by a start-up current/cut-out current that is low compared with a standard operating current during starting/stopping of the electrochemical unit ($40a$; $40b$), is used for calibrating the read-out function parameter.

* * * * *